United States Patent
Isci et al.

(10) Patent No.: US 9,323,317 B2
(45) Date of Patent: Apr. 26, 2016

(54) SYSTEM AND METHODS FOR DIMM-TARGETED POWER SAVING FOR HYPERVISOR SYSTEMS

(71) Applicant: INTERNATIONAL BUSINESS MACHINES CORPORATION, Armonk, NY (US)

(72) Inventors: Canturk Isci, Hawthorne, NY (US); Jeffrey O. Kephart, Hawthorne, NY (US); Suzanne K. McIntosh, Hawthorne, NY (US); Scott A. Piper, Kirkland, WA (US); Robert R. Wolford, Cleveland, OH (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 417 days.

(21) Appl. No.: 13/712,381

(22) Filed: Dec. 12, 2012

(65) Prior Publication Data

US 2014/0164810 A1     Jun. 12, 2014

(51) Int. Cl.
*G06F 1/32* (2006.01)
*G11C 5/04* (2006.01)
*G11C 5/14* (2006.01)

(52) U.S. Cl.
CPC ............ *G06F 1/3287* (2013.01); *G06F 1/3275* (2013.01); *G06F 1/3203* (2013.01); *G11C 5/04* (2013.01); *G11C 5/148* (2013.01); *Y02B 60/1228* (2013.01); *Y02B 60/1282* (2013.01); *Y02B 60/32* (2013.01)

(58) Field of Classification Search
CPC ............................ G06F 1/3287; G06F 1/3275
USPC ......................................................... 713/324
See application file for complete search history.

(56) References Cited

U.S. PATENT DOCUMENTS

| | | | |
|---|---|---|---|
| 6,523,102 B1 | 2/2003 | Dye et al. | |
| 8,140,808 B2 | 3/2012 | Rawson, III | |
| 8,239,667 B2 | 8/2012 | Durham | |
| 8,244,971 B2 | 8/2012 | Rajan et al. | |
| 2003/0023825 A1* | 1/2003 | Woo et al. | 711/170 |
| 2003/0182493 A1 | 9/2003 | Frame et al. | |
| 2004/0148481 A1* | 7/2004 | Gupta | G06F 1/3225 711/165 |
| 2007/0291571 A1 | 12/2007 | Balasundaram | |
| 2008/0005516 A1 | 1/2008 | Meinschein et al. | |
| 2009/0083561 A1 | 3/2009 | Kaburlasos et al. | |
| 2009/0216985 A1 | 8/2009 | O'Connor et al. | |
| 2009/0217072 A1* | 8/2009 | Gebhart et al. | 713/330 |

(Continued)

OTHER PUBLICATIONS

International Search Report Dated May 5, 2014.

(Continued)

*Primary Examiner* — Thomas Lee
*Assistant Examiner* — Volvick Derose
(74) *Attorney, Agent, or Firm* — F. Chau & Associates, LLC

(57) ABSTRACT

A method of saving power in a computing system having a plurality of dial in-line memory modules (DIMMs) and employing a suspend-to-RAM sleep mode includes, when entering suspend-to-RAM sleep mode, consolidating selected information into a subset of DIMMs, and turning off power to all other DIMMs. A DIMM power rail may be coupled to each of the DIMMs, the DIMM power rail being configured to selectively have power being supplied to respective DIMMs turned off in response to enable/disable logic signals.

7 Claims, 4 Drawing Sheets

(56) References Cited

U.S. PATENT DOCUMENTS

| | | | |
|---|---|---|---|
| 2010/0115179 A1 | 5/2010 | Carr et al. | |
| 2010/0149900 A1* | 6/2010 | Kitayama | G11C 8/08 365/230.03 |
| 2010/0235669 A1* | 9/2010 | Miyamuko | 713/324 |
| 2010/0313043 A1* | 12/2010 | Tsukada et al. | 713/320 |
| 2010/0328710 A1* | 12/2010 | Kimura | G06K 15/00 358/1.15 |
| 2011/0093654 A1* | 4/2011 | Roberts | G06F 1/3203 711/105 |
| 2011/0093726 A1* | 4/2011 | Worthington | G06F 1/3225 713/320 |
| 2011/0141838 A1* | 6/2011 | Kishibe | G11C 11/417 365/226 |
| 2011/0145609 A1* | 6/2011 | Berard | G06F 1/3203 713/320 |
| 2011/0154083 A1 | 6/2011 | Arndt et al. | |
| 2011/0246639 A1* | 10/2011 | Feder et al. | 709/224 |
| 2011/0283071 A1* | 11/2011 | Yokoya | G06F 1/3275 711/162 |
| 2012/0144144 A1* | 6/2012 | Worthington | G06F 12/0223 711/165 |
| 2012/0185706 A1 | 7/2012 | Sistla et al. | |
| 2012/0198136 A1 | 8/2012 | Moshayedi et al. | |
| 2012/0284475 A1* | 11/2012 | Zaarur | G06F 1/3275 711/165 |
| 2013/0166866 A1* | 6/2013 | Yerushalmi | G06F 1/3275 711/162 |

OTHER PUBLICATIONS

Ayoub et al., "Energy Efficient Proactive Thermal Management in Memory Subsystem," ISLPED'10 Aug. 18-20, 2010, Austin, Texas USA.

Power, "Engine Cylinder Deactivation Saves Fuel," J.D. Power and Associates, Feb. 24, 2012.

Freedman, "The Compression Cache: Virtual Memory Compression for Handheld Computers," www.cs.princeton.edu/~mfreed/docs/6.033/compression.pdf 2000.

\* cited by examiner

SYSTEM AND METHODS FOR DIMM-TARGETED POWER SAVING FOR HYPERVISOR SYSTEMS

BACKGROUND

1. Technical Field

The present disclosure relates to low power states for computer devices, and, more particularly, to improved power-savings for sleep mode.

2. Discussion of Related Art

In a server cluster, there may be servers that are not currently in use and thus put into sleep mode. While in sleep mode, the servers retain power to all the dual in-line memory modules (DIMMs) that are keeping a stored state active in order to turn back on faster when needed.

In order to save energy resources, many laptops and other computing systems provide the user with a capability that can place the computing system in a low-power sleep mode from which it can be awakened, or 'resumed', with low latency. The latency is especially short when the suspend-to-random access memory (RAM) sleep mode is selected. This mode can be designated as the 'S3 sleep mode', or 'S3', while the term 'S4 sleep mode', or 'S4' can be designated for a suspend-to-disk sleep mode.

During S3 sleep, the system state is preserved in memory, which is kept alive, in a lower-power, self-refresh mode. The wake up from S3 sleep is quite fast, since the compute node needs only to restore architectural state, and restore devices from their respective sleep modes and resume execution from the last point before suspension. The S4 sleep mode persists a system state in a disk in a special restore file, after which the entire system can be powered down. Therefore, S4 is a completely powered-off sleep state. However, since the system needs to restore its entire state from the disk on resume, it has a substantially longer resume latency as compared to S3, and, therefore, S3 is a desirable option for applications where system response latency is critical.

The availability of sleep modes is especially desirable in large-scale computing environments, such as cloud computing environments. Clouds provide tremendous compute power that, according to ample monitoring data that has been collected, often exceeds the demand. In the periods of under-utilization, one would like to reclaim the energy and energy costs whenever and wherever possible.

One option for saving energy and energy costs is to identify the under-utilized machines and turn them off. The disadvantage of this option is the extremely long latency incurred upon resuming the machine when it is found sometime later, or even worse, shortly later, that demand has surged. The long latency is attributed to the boot-up sequence which the machine must perform, including boot up of the operating system and hypervisor. In computing, a hypervisor, also called virtual machine manager (VMM), is one of many hardware virtualization techniques allowing multiple operating systems, typically termed "guests", to run concurrently on a host computer. The hypervisor presents to the guest operating systems a virtual operating platform and manages the execution of the guest operating systems. This boot-up process can take on the order of minutes. This long latency prevents the environment from responding in an agile way to computing demand.

The S3 and S4 sleep modes are better alternatives than powering down a computing system completely because the time to resume the machine is shorter. When a machine is put into a sleep state, hardware components including the central processing unit (CPU) are placed in a low-power state, thus saving considerable energy and energy costs. The machine resumes slower from S4 than from S3 because it must re-populate memory by reading the needed data from disk storage and writing that data into memory. This is necessary because during S4 sleep, memory is not powered and therefore loses its state.

The S3 sleep mode is the fastest to resume because memory remains powered while other components are placed in low-power states. The system state is retained and therefore memory does not need to be re-populated, which saves time on resume. However, the S3 sleep mode consumes more energy than S4.

Therefore, a need exists for reduced power consumption when in the sleep mode such that S3 energy-efficiency can be brought closer to that of S4, thereby retaining all of the low-latency resume benefits provided by S3 sleep, but also reducing energy waste and energy costs to close the gap with S4.

BRIEF SUMMARY

Exemplary embodiments of the present disclosure provide for reduced power consumption when in the sleep mode by consolidating necessary information into a subset of DIMMs and turning off power to the rest of the DIMMs.

In accordance with an exemplary embodiment the necessary data can be collected into a single memory DIMM and then all other DIMMs are shut off, power being held up only to the DIMM in which state data is stored. Compressing data can be chosen before storing to the DIMM in the event that the data to be stored will not fit into one DIMM without compression.

In accordance with an exemplary embodiment, knowledge about the utilization of memory across DIMMs installed in a server can be leveraged to shut off power to DIMMs that are not currently utilized. In particular, this knowledge can be exploited when a server or other computing device enters the S3 sleep mode (i.e., a suspend-to-RAM sleep mode). By shutting down unutilized DIMMs while a server is asleep, energy efficiency can be greatly enhanced and the gap between the long-latency S4 sleep mode and the short-latency S3 sleep mode can be narrowed.

In accordance with an exemplary embodiment, the disclosed DIMM power savings technique becomes especially powerful in scenarios where the configured physical memory of a compute node is significantly larger than the footprint of the system that is targeted for suspension. A very common case for such an opportunity emerges particularly in virtualized systems that employ dynamic consolidation. In these systems, the physical node resources, including memory, are sized for the multitude of virtual machines (VMs) the node is to host while active, while the underlying hypervisor is a thin, small-footprint, layer to achieve VM monitor and local resource management functions. With dynamic consolidation, when overall cluster demand is low, there is opportunity for power savings. The VMs are evacuated from a subset of hosts to the rest of the cluster and the emptied hosts become candidates for power-off, which at this point only hold the small hypervisor state in memory. Therefore, this inherently disparate state between the small active, mapped memory on these system versus the substantially (multiple orders of magnitude) larger actual physical memory gives way to a very concrete and highly beneficial application of the proposed technique.

In accordance with an exemplary embodiment, a method of saving power in a computing system having a plurality of DIMMs and employing a suspend-to-RAM sleep mode is provided. When entering suspend-to-RAM sleep mode, selected information is consolidated into a subset of DIMMs, and power to all other DIMMs is turned off.

The selected information may be collected into a single memory DIMM and all other DIMMs are shut off, such that power is provided only to the DIMM in which the selected information is stored.

The computing system may include an installed and running hypervisor and have no active users, and the selected information being consolidated may be hypervisor data.

The method may further include, upon entering suspend-to-RAM sleep mode, determining a set of memory locations that will be needed upon awakening from suspend-to-RAM sleep mode, and turning off all DIMMs that do not contain a single element from the set of memory locations that will be needed upon awakening from suspend-to-RAM sleep mode.

Upon detecting a request to awaken from suspend-to-RAM sleep mode, all DIMMs may be turned on.

According to an exemplary embodiment, a method of turning off a host computing system having a hypervisor and a plurality of DIMMs, and employing suspend-to-RAM sleep mode is provided. Hypervisor page-DIMM mappings are identified. A determination is made as to whether memory compaction is enabled. If memory compaction is enabled, hypervisor memory states are compacted into a minimum subset of DIMMs and host to memory interaction is suspended. If memory compaction is not enabled, host to memory interaction is merely suspended. Upon suspending host to memory interaction, power to all DIMMs that have no hypervisor pages is turned off.

According to an exemplary embodiment, a method of turning on an evacuated and suspended host computing system having a hypervisor and a plurality of DIMMs, and employing suspend-to-RAM sleep mode, is provided. Power to all DIMMs that were turned off is turned on. Host to memory communication is resumed. A determination is made as to whether memory compaction is enabled. If memory compaction is enabled, hypervisor memory state is restored into an actual set of DIMMs and host wakeup is finalized. If memory compaction is not enabled, host wakeup is merely finalized.

According to an exemplary embodiment, an apparatus for saving power in a computing system having a plurality of DIMMs and employing suspend-to-RAM sleep mode, is provided. A DIMM power rail is coupled to each of the DIMMs, the DIMM power rail configured to selectively have power being supplied to respective DIMMs turned off in response to enable/disable logic signals.

The apparatus may further include a respective electrical switch between the DIMM power rail and each DIMM such that a respective logic signal is used to selectively control the power supplied to each respective DIMM.

A hypervisor may fit within one or two of the DIMMs and power applied to the DIMM power rail may be configured to be turned off for all except the one or two DIMMs when the computing system goes into the suspend-to-RAM sleep mode.

The computing system may be in a large-scale cloud computing environment.

BRIEF DESCRIPTION OF THE SEVERAL VIEWS OF THE DRAWINGS

Exemplary embodiments will be more clearly understood from the following detailed description taken in conjunction with the accompanying drawings in which.

DETAILED DESCRIPTION

Figure 1:
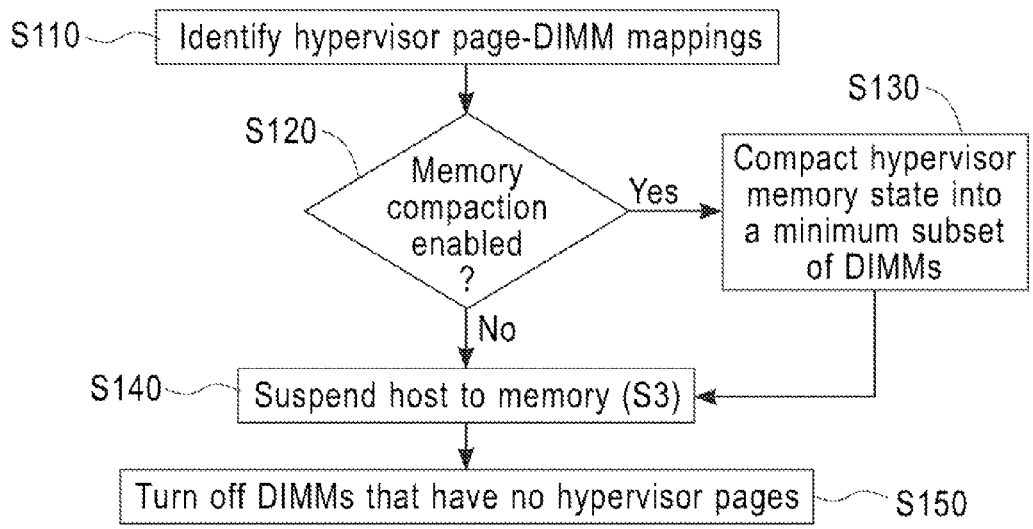
FIG. 1 depicts a flow chart for turning off a host after evacuation.

Reference will now be made in more detail to the exemplary embodiments which are illustrated in the accompanying drawings, wherein like reference numerals refer to the like elements throughout.

As stated earlier, in accordance with the present disclosure S3 energy-efficiency can be brought closer to that of S4, while still retaining all of the low-latency resume benefits provided by the S3 sleep mode. Exemplary embodiments of the present disclosure make it possible to modify the S3 sleep mode such that only a subset of the DIMMs installed in a computer system are powered during S3 sleep. This approach is most effective when the configured physical memory of the target system is significantly larger than its current memory footprint of the system, and the suspend logic needs to retain only this small footprint on resume.

Consider a computer system CS1, in which there is a hypervisor installed and running, but there are no active users of this computer. The system may be in this under-utilized state because the users may have terminated all of their VMs, leaving only the hypervisor running Another possibility is that some higher level resource management software has detected an opportunity to consolidate workloads into fewer physical machines (PMs), by evacuating all the VMs in this particular CS1 machine, onto other PMs in the virtualized cluster.

With CS1 now under-utilized, a reasonable choice is to power down the system or place it in the S3 or S4 low power state. S3 is selected because it will provide a low-latency resume in case there is a demand spike, while still saving energy during this quiet period.

A series of steps are performed (in just seconds) to place CS1 into the S3 sleep state. Recall that in S3, many system components are placed into a low-power mode, however all memory DIMMs are powered.

In the scenario described above, the knowledge can be leveraged that upon resume, only the hypervisor will be running, that is, there are no applications, no VMs, that will need to be resumed. Therefore, only a tiny bit of memory needs to be powered, i.e., the part that contains data belonging to the hypervisor. The rest of the DIMMs contain residual data left behind when VMs were terminated or migrated off of CS1. This data will never be needed again, yet in S3 powering the DIMMs to keep this unneeded data from disappearing can be wasteful.

Instead of powering all of these DIMMs to retain data that is unneeded, in accordance with an exemplary embodiment, the following will be undertaken when CS1 enters S3 sleep mode:

1. Detect S3 request.
2. Begin steps required to enter S3 mode.
3. Determine the set of memory locations (Mres) that will be needed upon resume.
4. Turn off all DIMMs that do not contain a single element from the set Mres.
5. Complete any final steps for entering S3 sleep mode.

In step 3 above, Mres can be generated in various ways. Three of such options are highlighted below with varying levels of complexity and efficiency:
1. Mres for the hypervisor can be explicitly defined by setting the memory allocated for the hypervisor's use to a fixed location, such as low memory. In this case, the physical mappings of the required memory is known a priori during suspend, and the unneeded DIMMs can be turned off.
2. Mres can be determined by walking the page tables of the host system to identify memory locations that have been allocated to the hypervisor. The remainder of the DIMMs can be powered off.
3. Mres can be determined by walking the page tables, identifying active, mapped pages, and compacting them to a small subset of DIMMs that can fit the pages that need to be kept alive. After memory compaction, a potentially larger (compared to option 2) set of DIMMs can be turned off.

When CS1 resumes from S3 sleep mode, the following steps are undertaken:
1. Resume request is detected.
2. Turn on all DIMMs.
3. Begin steps required to resume from S3 sleep mode.
4. Complete any final steps to resume from S3 sleep mode.

Note that in the scenario described, the hypervisor is the only software that must be resumed following S3 sleep mode, so that Mres may be obtained easily because memory locations used by the hypervisor are well-defined. However, if this were not the case, it is possible to obtain Mres by invoking existing system calls and walking page tables as needed.

This same processing would be employed in the event that the S3 resume operation required one or more VMs to be resumed in addition to resuming the hypervisor. In this extended scenario, it is possible that Mres could be spread across multiple, or even all, DIMMs. In the most extreme case, it may be determined that no DIMMs can be completely shut down, however, it is possible to consolidate all data referenced by Mres into a compressed image (memory compaction) that would fit on less than the total number of installed DIMMs, thereby allowing one or more DIMMs to be shut down.

In FIG. 1, there is depicted a flow chart for turning off the host after evacuation. At step S110 hypervisor page-DIMM mappings are identified. At step S120 a determination is made as to whether memory compaction is enabled. If memory compaction is enabled (Y) hypervisor memory state is compacted at step S130 into a minimum subset of DIMMs and host to memory is suspended (S3) at step S140. If memory compaction is not enabled (N) host to memory is merely suspended (S3) at step 140. At step S150 DIMMs that have no hypervisor pages are turned off.

Figure 2:
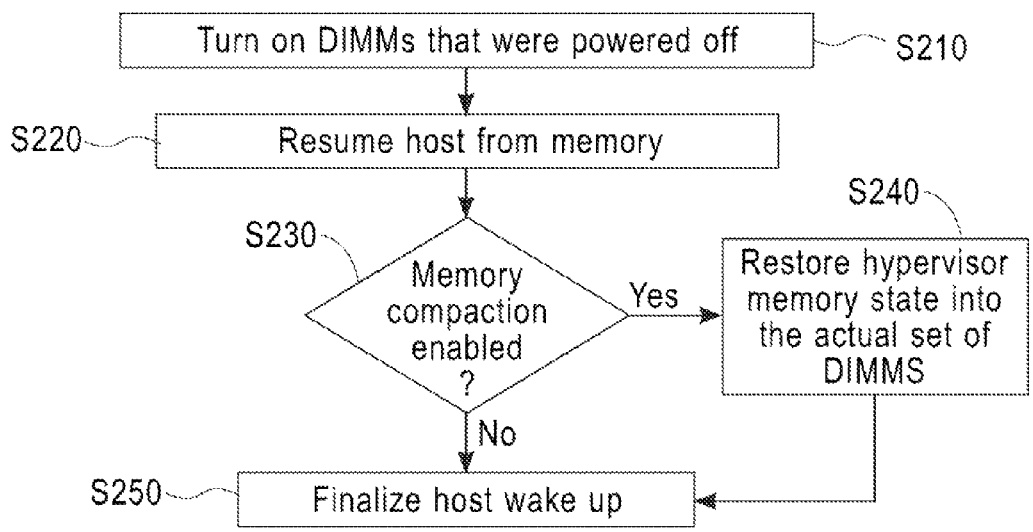
FIG. 2 depicts a flow chart for turning on an evacuated and suspended host.

In FIG. 2, there is depicted a flow chart for turning on an evacuated and suspended host. In step S210 DIMMs that were powered off are turned on. In step S220, host is resumed from memory. In Step S230 a determination is made as to whether memory compaction is enabled. If memory compaction is enabled (Y), in step S240 hypervisor memory state is restored into the actual set of DIMMs and host wakeup is finalized in step S250. If memory compaction is not enabled (N), host wakeup is merely finalized in step S250.

Figure 3:
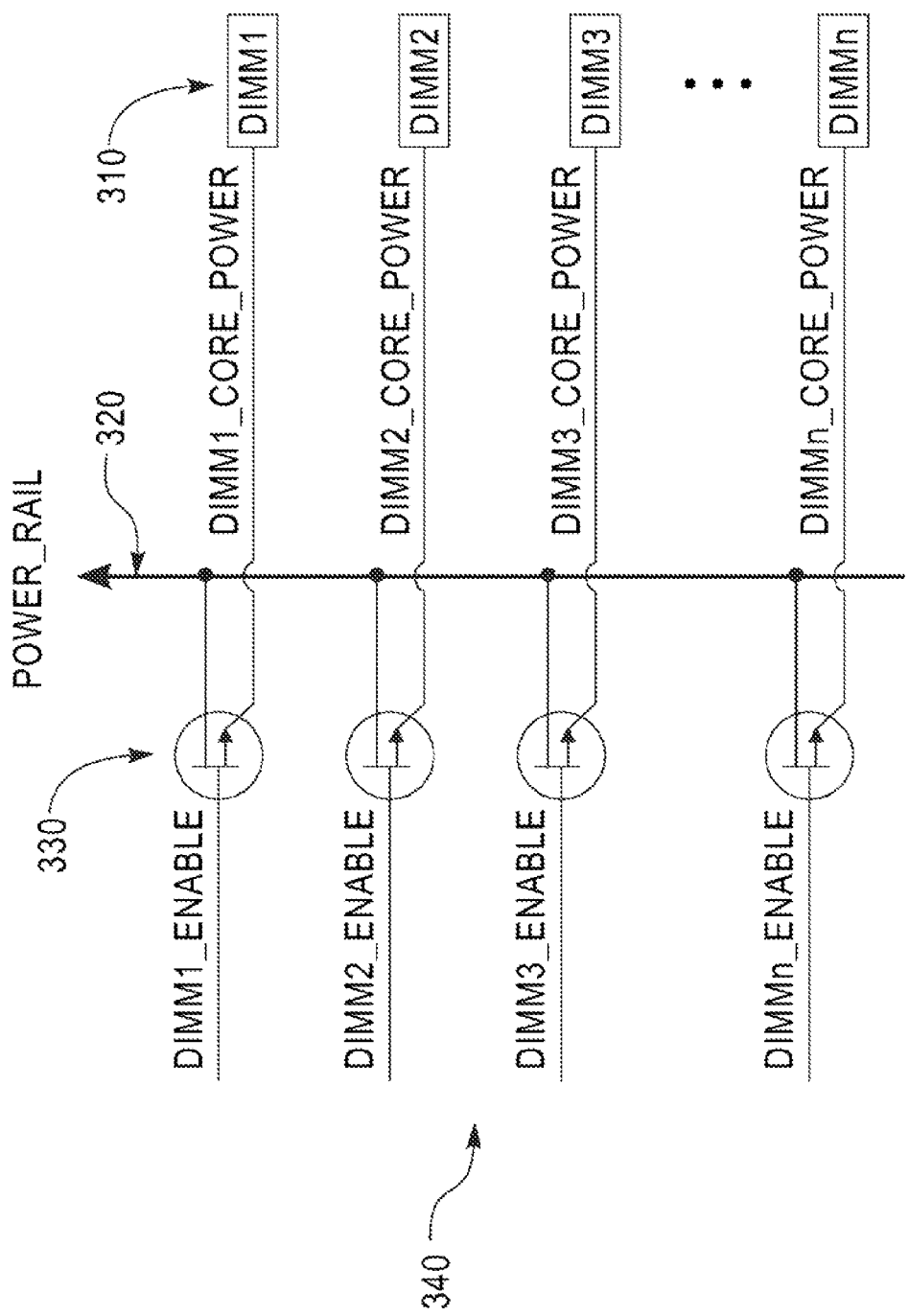
FIG. 3 depicts a circuit for selectively turning off power to DIMMs.

Referring now to FIG. 3, power to DIMM1, DIMM2, DIMM3, DIMMN 310 can be selectively turned off by adding logic to a motherboard to enable/disable the supply of power. In today's servers, there are typically 1 or 2 voltage regulators that feed power to the DIMM's core rail 320. In this approach, power can be controlled only with coarse granularity, i.e. either half or all DIMMs can be powered off. By placing an electrical switch 330 between the DIMM core power rail 320 and each DIMM 310 a plurality logic signals 340 can then be used to selectively control the power on respective single DIMMs. This hardware can be controlled through hooks or other software mechanisms provided for use by the S3 sleep software. Alternately, the machine can complete its S3 sleep processing and allow a service processor to power down those DIMMs whose memory contents do not need to be preserved through S3 sleep.

With the circuit shown in FIG. 3, if the hypervisor fits within DIMM1 and DIMM2, then when the system goes into S3 state, the core power is turned off for all except DIMM1 and DIMM2.

Note that in an example of standard double data rate (DDR) DIMMs, there are multiple power rails that connect to the DIMMs, e.g., input/output voltage (VIO), supply voltage to output buffers of the memory chip (VDDQ), and supply voltage to a CPU (Vcore). However, the switch is only needed on the core power rail. This is because all other power rails are always turned off in S3. Only the core power rail is needed to maintain the contents of the DIMM when the system is in S3.

As described above, an exemplary embodiment for this proposed technique is in a virtualized setting, where VMs are dynamically consolidated into a varying number of hosts as their demands change. As overall demand decreases, cluster is "squeezed" into fewer hosts, and some of the hosts are "evacuated" and put in low-power state. As demand increases, more hosts are needed, and therefore the cluster is "expanded" by bringing up some of the offline hosts back online and "repopulating" these hosts with VMs. In this common use case, the only idle state that is managed during suspend/resume cycles is, by design, the thin, small-footprint hypervisor layer.

Figure 4:
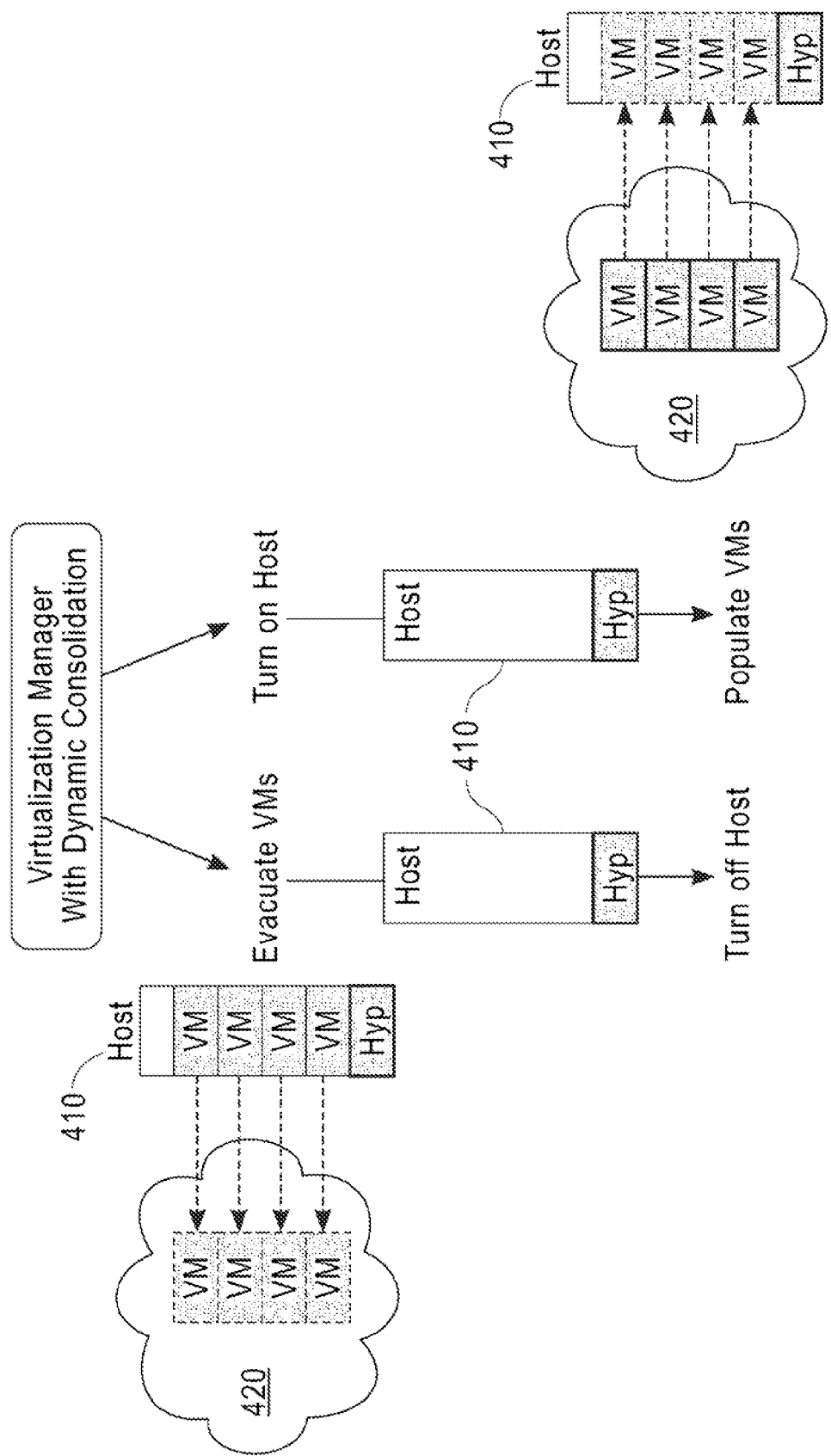
FIG. 4 depicts evacuate/turn-off (squeeze) and turn-on/populate (expand) paths for a single host.

A depiction of this is shown in the FIG. 4 for both the evacuate/turn-off (squeeze) and turn-on/populate (expand) paths. For simplicity, FIG. 4 is shown with a single host 410 going through the power state transition, while the rest of the cluster is represented with the shown cloud 420. The proposed technique works particularly well in this example as the large hypervisor memory configuration serves only a very small hypervisor state, which can be very compactly stored, relieving the remainder portion of the physical memory from holding active state. On resume, the only state needed to be restored is the hypervisor state. In such an application, a simple brute-force approach for walking through the few mapped hypervisor pages to identify (potentially compact) and preserve their physical mappings can be done very efficiently. While the discussion so far in this disclosure has been on DIMM-granularity power management, the same techniques can, in a straightforward manner, be generalized to other memory subsystem components such as rank-level or individual memory chip-level power management.

Figure 5:
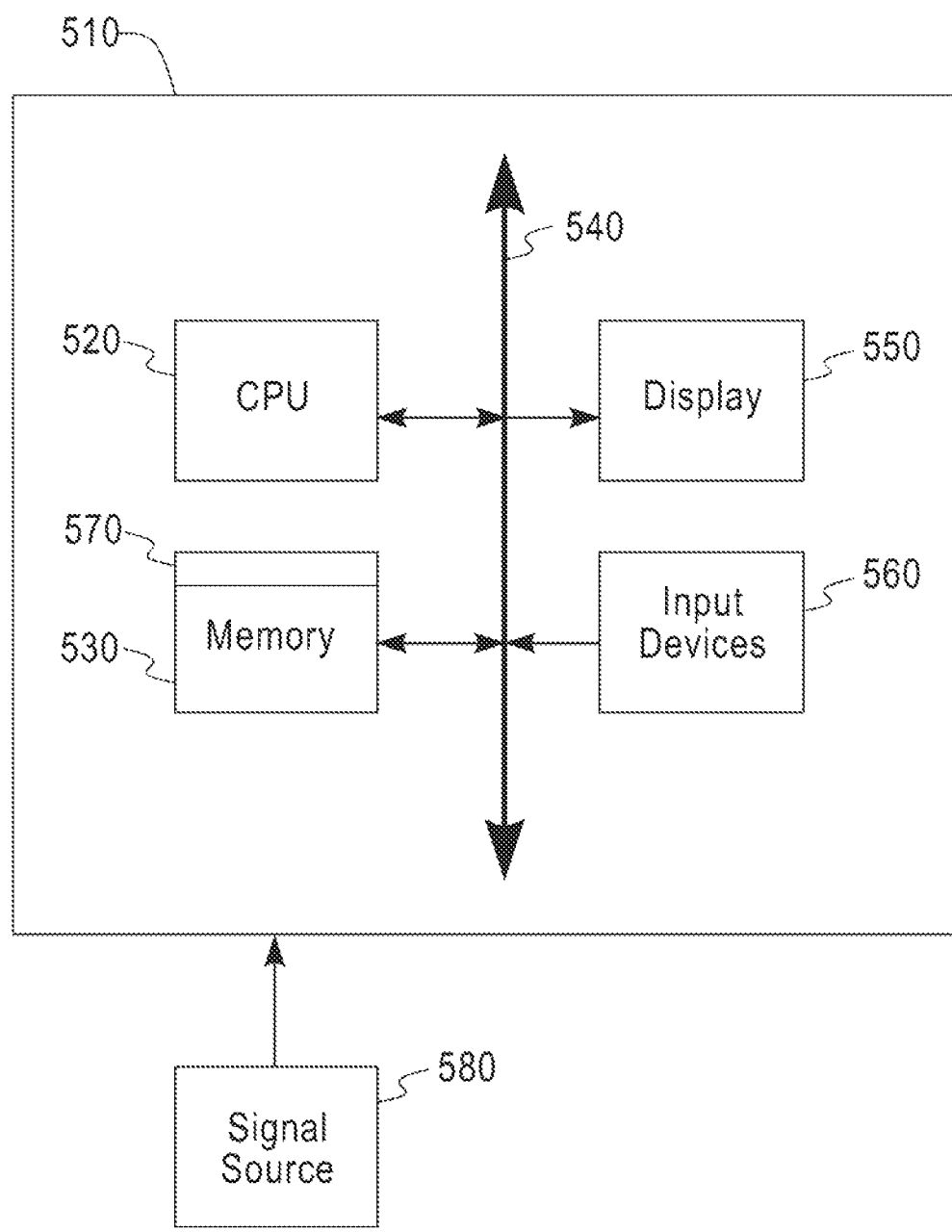
FIG. 5 depicts an exemplary computer system which can utilize the exemplary devices and methodology of the present disclosure.

The methodologies of the exemplary embodiments of the present disclosure may be particularly well suited for use in various electronic devices or systems. Accordingly, as depicted in FIG. 5, exemplary embodiments may take the form of an embodiment combining software and hardware aspects that may all generally be referred to as a "processor", "circuit," "module" or "system." Furthermore, exemplary implementations may in part take the form of computer program products for executing hardware functions and embodied in one or more computer readable medium(s) having computer readable program code stored thereon.

Any combination of one or more computer usable or computer readable medium(s) may be utilized. The computer-usable or computer-readable medium may be a computer readable storage medium. A computer readable storage medium may be, for example but not limited to, an electronic, magnetic, optical, electromagnetic, infrared, or semiconductor system, apparatus, device, or any suitable combination of the foregoing. More specific examples (a non-exhaustive list) of the computer-readable storage medium would include the following: a portable computer diskette, a hard disk, a random access memory (RAM), a read-only memory (ROM), an erasable programmable read-only memory (EPROM or Flash memory), an optical fibre, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus or device.

Computer program code for carrying out operations of the exemplary embodiments may be written in any combination of one or more programming languages, including an object oriented programming language such as Java, Smalltalk, C++ or the like, conventional procedural programming languages, such as the "C" programming language or similar programming languages, and assembly language or microcode. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Exemplary embodiments are described herein with reference to signal arrows and/block diagrams. It will be understood that each block of the block diagrams, and combinations of blocks in the block diagrams, can be implemented by hardware accompanied by computer program instructions.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

For example, FIG. 5 is a block diagram depicting an exemplary computer system, which can utilize the devices and methodology described above. The computer system 510 may include a processor 520, memory 530 coupled to the processor (e.g., via a bus 540 or alternative connection means), as well as input/output (I/O) circuitry 550, 560 operative to interface with the processor 520. The processor 520 may be configured to perform one or more methodologies described in the present disclosure, illustrative embodiments of which are shown in the above figures and described herein. Embodiments of the present disclosure can be implemented as a routine 570 that is stored in memory 530 and executed by the processor 520 to process the signal from the signal source 580. As such, the computer system 510 is a general-purpose computer system that becomes a specific purpose computer system when executing the routine 570 of the present disclosure.

It is to be appreciated that the term "processor" as used herein is intended to include any processing device, such as, for example, one that includes a central processing unit (CPU) and/or other processing circuitry (e.g., digital signal processor (DSP), microprocessor, etc.). Additionally, it is to be understood that the term "processor" may refer to a multi-core processor that contains multiple processing cores in a processor or more than one processing device, and that various elements associated with a processing device may be shared by other processing devices.

It is to be appreciated that the term "processor" as used herein is intended to include any processing device, such as, for example, one that includes a central processing unit (CPU) and/or other processing circuitry (e.g., digital signal processor (DSP), microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., printer, monitor, etc.) for presenting the results associated with the processor.

The block diagrams in the figures illustrate the architecture, functionality, and operation of possible implementations of systems, methods and computer program products according to various embodiments. In this regard, each block in the block diagrams may represent a module, segment, or portion of code, which comprises one or more executable instructions for implementing the specified logical function(s). It should also be noted that, in some alternative implementations by those skilled in the art, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

In accordance with exemplary embodiments of the present disclosure, in order to save energy resources, computing systems can be placed in a low-power sleep. The awake-latency is short for the suspend-to-RAM sleep mode. The suspend-to-disk mode has substantially longer resume latency and is not applicable when latency is critical. Exemplary embodiments of the present disclosure leverages knowledge about the utilization of memory across DIMMs installed in a server to shut off power to DIMMs that are not utilized. By shutting down unutilized DIMMs in sleep mode, energy efficiency is enhanced. The disclosed technique becomes especially powerful in scenarios where the configured memory of a compute node is significantly larger than the footprint of the system that is targeted for suspend.

Although illustrative embodiments of the present disclosure have been described herein with reference to the accompanying drawings, it is to be understood that the present disclosure is not limited to those precise embodiments, and that various other changes and modifications may be made therein by those skilled in the art without departing from the scope of the appended claims.

What is claimed is:

1. A method of saving power in a computing system having a plurality of dual in-line memory modules (DIMMs) and employing suspend-to-random access memory (RAM) sleep mode, the method comprising:
   coupling the DIMMs to a common core power line and controlling each DIMM by respective switches, and
   when detecting a suspend-to-RAM sleep mode request from a user interfacing with a processor of the computer system through an input device,
      consolidating selected information into a subset of DIMMs without moving non-selected information into a non-volatile memory separate from the DIMMs; and
   turning off power to all other DIMMs.

2. The method of claim 1, wherein the selected information is collected into a single memory DIMM and all other DIMMs are shut off, such that power is provided only to the DIMM in which the selected information is stored.

3. The method of claim 1, wherein the computing system includes an installed and running hypervisor and has no active users, and the selected information being consolidated is hypervisor data.

4. The method of claim 1, wherein the computing system is in a large-scale cloud computing environment.

5. The method of claim 1, further comprising upon entering suspend-to-RAM sleep mode:
   determining a set of memory locations that will be needed upon awakening from suspend-to-RAM sleep mode; and
   turning of all DIMMs that do not contain a single element from the set of memory locations that will be needed upon awakening from suspend-to-RAM sleep mode.

6. The method of claim 1, wherein upon detecting a request to awaken from RAM sleep mode, all DIMMs are turned on.

7. A method of turning off a host computing system having a hypervisor and a plurality of dual in-line memory modules (DIMMs), and employing suspend-to-random access memory (RAM) sleep mode, the method comprising:
   coupling the DIMMs to a common core power line and controlling each DIMM by respective switches;
   detecting a suspend-to-RAM sleep mode request from a user interfacing with a processor of the compute system through an input device;
   identifying hypervisor page-DIMM mappings;
   determining whether memory compaction is enabled;
   if memory compaction is enabled, competing hypervisor memory states into a minimum subset of DIMMs and suspending host to memory interaction,
   if memory compaction is not enabled, suspending host to memory interaction; and
   upon suspending host to memory interaction, turning off power to all DIMMs that have no hypervisor pages without making a determination as to whether data is being transferred to non-volatile memory,
   wherein the hypervisor is a virtual machine manager that manages multiple operating systems to run concurrently on the host computing system.

* * * * *